United States Patent [19]

Tanaka et al.

[11] Patent Number: 5,379,256
[45] Date of Patent: Jan. 3, 1995

[54] ELECTRICALLY ERASABLE PROGRAMMABLE READ-ONLY MEMORY WITH WRITE/VERIFY CONTROLLER

[75] Inventors: Tomoharu Tanaka, Yokohama; Yoshiyuki Tanaka, Tokyo; Kazunori Ohuchi, Yokohama; Masaki Momodomi, Yokohama; Yoshihisa Iwata, Yokohama; Koji Sakui, Tokyo; Shinji Saito, Yokohama; Hideki Sumihara, Ooita, all of Japan

[73] Assignee: Kabushiki Kaisha Toshiba, Kawasaki, Japan

[21] Appl. No.: 223,307

[22] Filed: Apr. 5, 1994

Related U.S. Application Data

[63] Continuation of Ser. No. 834,200, Feb. 12, 1992, abandoned.

[30] Foreign Application Priority Data

Feb. 19, 1991 [JP] Japan .................. 3-024769
Mar. 29, 1991 [JP] Japan .................. 3-091469

[51] Int. Cl.$^6$ ............................. G11C 7/00
[52] U.S. Cl. .................. 365/185; 365/189.01; 365/189.09
[58] Field of Search ............ 365/185, 189.01, 189.09

[56] References Cited

U.S. PATENT DOCUMENTS

| | | |
|---|---|---|
| 4,677,590 | 6/1987 | Arakawa . |
| 4,939,690 | 7/1990 | Momodomi et al. . |
| 4,959,812 | 9/1990 | Momodomi et al. ........... 365/185 |
| 5,053,990 | 10/1991 | Kreifels et al. ........... 365/185 |
| 5,124,945 | 6/1992 | Schreck ........... 365/185 |
| 5,172,338 | 12/1992 | Mehrotra et al. ........... 365/185 |

FOREIGN PATENT DOCUMENTS 3-17894 1/1991 Japan .
3-58390 3/1991 Japan .

OTHER PUBLICATIONS

Franzis-Verlag, Munich, 1984, pp. 374-275, D. Nuhrmann, "Das Grosse Werkbuch Elekrtonik".

*Primary Examiner*—Eugene R. LaRoche
*Assistant Examiner*—Christophor R. Glembocki
*Attorney, Agent, or Firm*—Oblon, Spivak, McClelland, Maier & Neustadt

[57] ABSTRACT

A plurality of electrically erasable programmable read-only memories or EEPROMs are associated with a controller LSI. Each EEPROM includes an array of floating-gate tunneling memory cell transistors arranged in rows and columns. When a sub-array of memory cell transistors providing a one-page data is selected for programming, the controller LSI performs a write/verify operation as follows the electrically written state after the programming of the selected memory cell transistors is verified by checking their threshold values for variations, and when any potentially insufficient cell transistor remains among them, the rewrite operation using a predetermined write voltage for a predetermined period of time is repeated so that the resultant write state may come closer to a satisfiable reference state. Each rewrite/verify operation is performed by applying the write voltage to the insufficient cell transistor for a predetermined period of time.

20 Claims, 12 Drawing Sheets

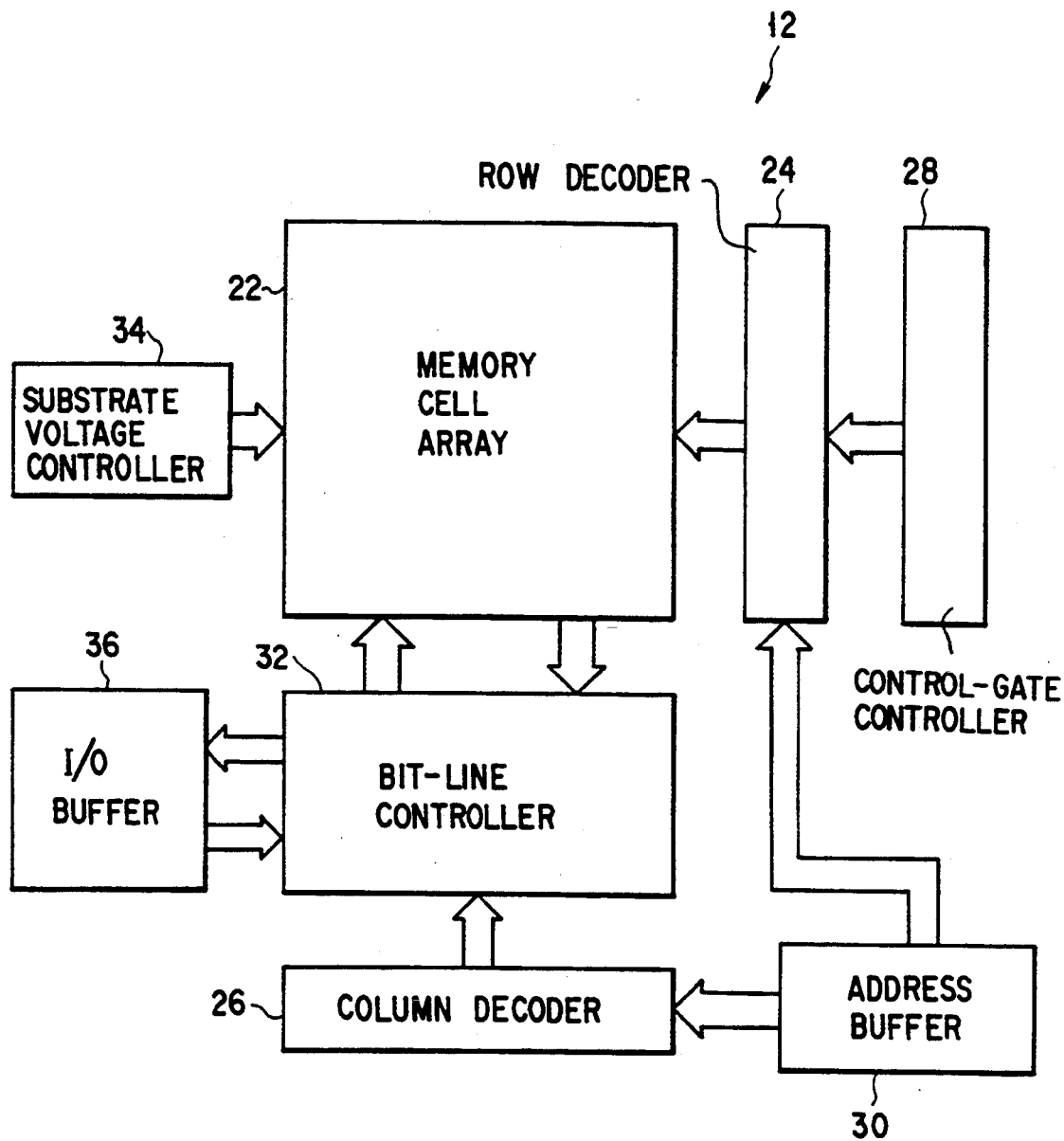
F I G. 3

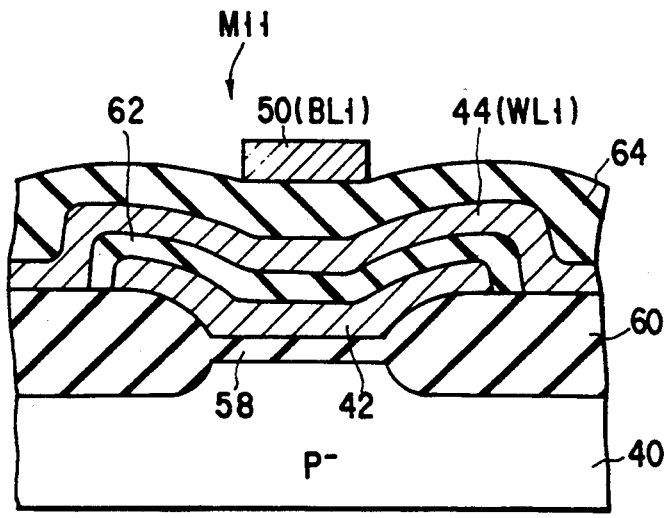
F I G. 6
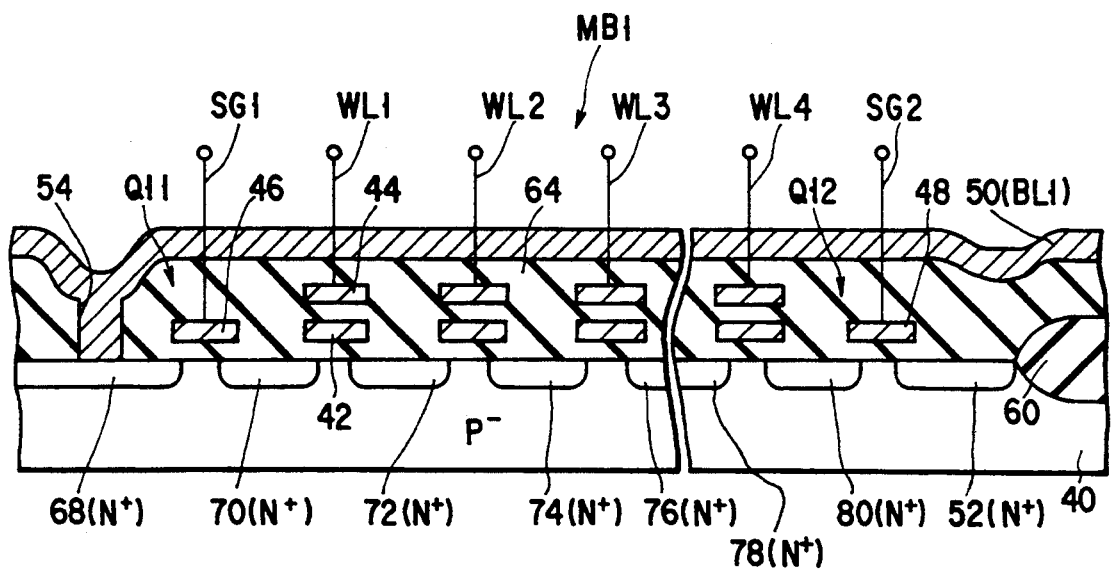
F I G. 7

ELECTRICALLY ERASABLE PROGRAMMABLE READ-ONLY MEMORY WITH WRITE/VERIFY CONTROLLER

This application is a continuation of application Ser. No. 07/834,200, filed on Feb. 12, 1992, now abandoned.

BACKGROUND OF THE INVENTION

1. Field of the Invention

This invention relates generally to non-volatile semiconductor memory devices, and more particularly to an electrically erasable and programmable semiconductor memory system that includes an array of memory cells, including series circuits of NAND type memory cells.

2. Description of the Related Art

With the increasing needs for high performance and high reliability of digital computer systems, it is demanded more and more to develop a large-capacity non-volatile semiconductor memory that can replace an existing external data-storage medium, such as a magnetic diskette, a fixed disk unit (which is sometimes called a "hard disk unit"), or the like.

Recently, to fulfill the expanding end-user's demands, a specific electrically erasable programmable non-volatile read-only memory (EEPROM) has been proposed and developed, wherein the integration density of memory cells is greatly enhanced by reducing the number of necessary transistors on a chip substrate of limited size. The EEPROM of this type is generally called a "NAND cell type EEPROM," in which a plurality of series arrays (circuits) of memory cell transistors are connected to bit lines by way of switching transistors, respectively. The memory cell transistors are floating gate metal oxide semiconductor field effect transistors (MOSFETs). When a switching transistor turns on, one cell transistor array is selectively connected to a corresponding bit line associated therewith. This switching transistor is called a "select transistor." The series arrays of cell transistors may be called the "NAND cell units."

Each NAND cell unit includes four, eight, or sixteen floating gate type MOSFETs as their minimum storage elements. Each MOSFET has a control gate connected to a corresponding word line, and a floating gate for storing charge carriers representing a logic "1" or "0" data. Since each "memory cell" includes only one transistor, the integration density of the EEPROM is improved to increase the total storage capacity thereof.

With the presently available NAND type EEPROMs, during a write operation, non-selected memory cells in each NAND cell unit function as transfer gates to transfer a data-bit to a target cell being presently selected. For convenience of explanation, the following discussion is made with respect to one NAND cell unit. A select transistor associated the NAND cell unit turns on causing this cell unit to be connected to a corresponding bit line. Those memory cell transistors between the select transistor and the selected cell transistor are externally controlled to turn on. A write data may have a particular logical value, "1" or "0." Assuming that the write data is a "1," the data voltage supplied from the bit line is transferred to the selected cell transistor via those turned-on transistors. Charge carriers are thus injected from the drain electrode into the floating gate of the selected cell transistor, thereby to charge it. The threshold value of the selected transistor changes, allowing the 1-bit data to be written or programmed therein.

To improve the operating reliability, a specific requirement is placed on the non-selected memory cell transistors acting as the transfer gates in the write operation: Their threshold values should be limited in the variation range. These transistors are prohibited from fluctuating beyond an allowable variation range; otherwise, the write voltage for the selected cell itself varies among NAND cell units, which will decrease the programming reliability. With well-known programming techniques used in the existing NAND type EEPROMs, it is not easy to meet the requirement. This is because most memory cell transistors on a one-chip substrate inherently exhibit different threshold values to be caused by variations in the manufacturing processes and the physical conditions. This fact may undesirably allow that relatively easy-to-write cells coexist with comparatively hard-to-write cells on the same chip substrate. Consequently, it is impossible to expect all addressing operations to be done in a uniformly organized manner. In addition, the operating reliability cannot be maintained at a desired level.

SUMMARY OF THE INVENTION

It is therefore an object of the present invention to provide a new and improved non-volatile semiconductor memory system.

It is another object of the invention to provide an electrically erasable and programmable read-only memory device capable of effectively performing program operations without sacrificing high reliability.

In accordance with the above objects, the invention is addressed to a specific non-volatile semiconductor memory system, which includes an array of electrically erasable and programmable memory cell transistors arranged in rows and columns. When a sub-array of memory cell transistors that provides a one-page data is selected for programming from among the memory cell array, a write/verify operation is performed as follows: (1) the resultant electrical write state of the selected memory cell transistors after the programming is verified by checking whether their threshold values are varied, and (2) if any insufficiently written memory cell transistor remains among them, a rewrite operation is executed therefor so as to cause the write state to come closer to the satisfiable state by applying thereto a predetermined write voltage for a predetermined period of time and by repeating such rewrite operation if necessary. Each rewrite operation is performed by applying the write voltage to the insufficiently written memory cell transistor(s) for a fixed length of time. For rewrite/verify operations, the rewrite operation on the insufficient cell transistor(s) may be repeated within the range of a predetermined number of times until the written state reaches a satisfactory state.

The foregoing and other objects, features, and advantages of the invention will become apparent from the following more particular description of preferred embodiments of the invention, as illustrated in the accompanying drawings.

BRIEF DESCRIPTION OF THE DRAWINGS

FIG. 3 is a diagram illustrating the internal circuit configuration of one of the NAND type electrically erasable programmable read-only memories (EEPROMs) of FIG. 2.

FIG. 6 is a diagram showing the enlarged sectional view of a memory cell transistor of the NAND cell unit taken along the line VI—VI of FIG. 5.

FIG. 7 is a diagram showing another enlarged sectional view of the memory cell transistor of the NAND cell unit along the line VII—VII of FIG. 5.

DETAILED DESCRIPTION OF THE PREFERRED EMBODIMENTS

Figure 1:
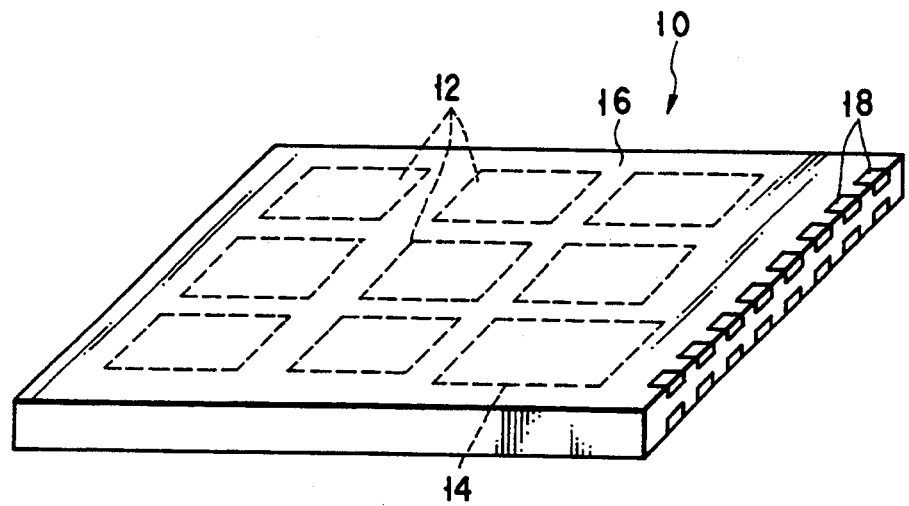
FIG. 1 is a diagram schematically showing the perspective view of an integrated circuit (IC) card module including therein a non-volatile semiconductor memory system in accordance with one preferred embodiment of the invention.

Referring now to FIG. 1, a card-like data-storage device in accordance with one preferred embodiment of the invention is generally designated by numeral "10." The device 10 will be called an "IC card module" or "IC card" hereinafter. IC card 10 includes a plurality of of NAND cell type electrically erasable and programmable read-only memory (EEPROM) chips 12 and a controller LSI chip 14 associated therewith. These components 12 and 14 are embedded in a main body 16 of IC card 10.

Figure 2:
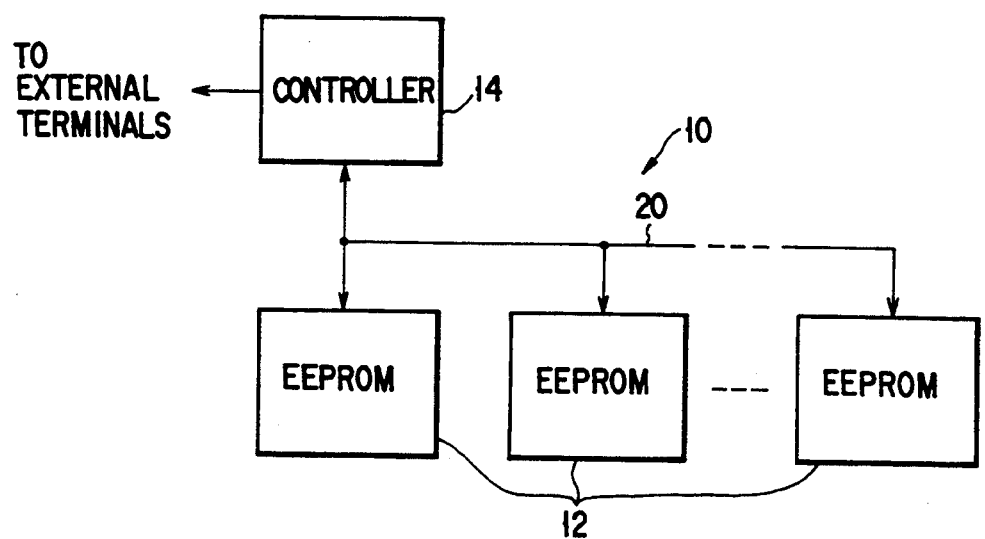
FIG. 2 is a diagram showing the internal circuit configuration of the IC card shown in FIG. 1.

The main body 16 has an external connection section, wherein a number of external connection terminal pads 18 are arranged at constant intervals. When the IC card is plugged into the slot of a digital computer unit (not shown), those pads are electrically connected to corresponding connection terminals, thus allowing bidirectional data transmission therebetween. EEPROMs 12 are coupled with controller LSI 14 by way of a data transfer line 20 as shown in FIG. 2.

The internal circuitry of one of the NAND-type EEPROMs 12 is illustrated in FIG. 3. The remaining EEPROMs have similar arrangement. EEPROM 12 has a cell array section 22, which includes an array of memory cells arranged in rows and columns to provide a matrix configuration, which will be described in detail later. Cell array section 22 is connected to a row decoder circuit 24 and a column decoder circuit 26. A control-gate controller 28 is connected to row decoder 24. An address buffer section 30 is connected to decoders 24, 26. An input address bit is transferred to row and column decoders 24, 26 via address buffer 30. A bit-line control circuit 32 for execution of read and write operations is associated with memory section 22 and column decoder 26 as shown in FIG. 3. A substrate voltage control circuit 34 is provided for controlling the voltage of a chip substrate, on which memory section 22 is arranged with circuits 24, 26, 28, 30, 32, 34. Control circuit 34 generates a suitable control signal in accordance with a write, a read or a "read-verify" operation, and to provide it to a control gate line that is being selected by row decoder 24 from among those associated with the rows of memory cells. An I/O buffer 36 is connected with first bit-line controller 32.

Figure 4:
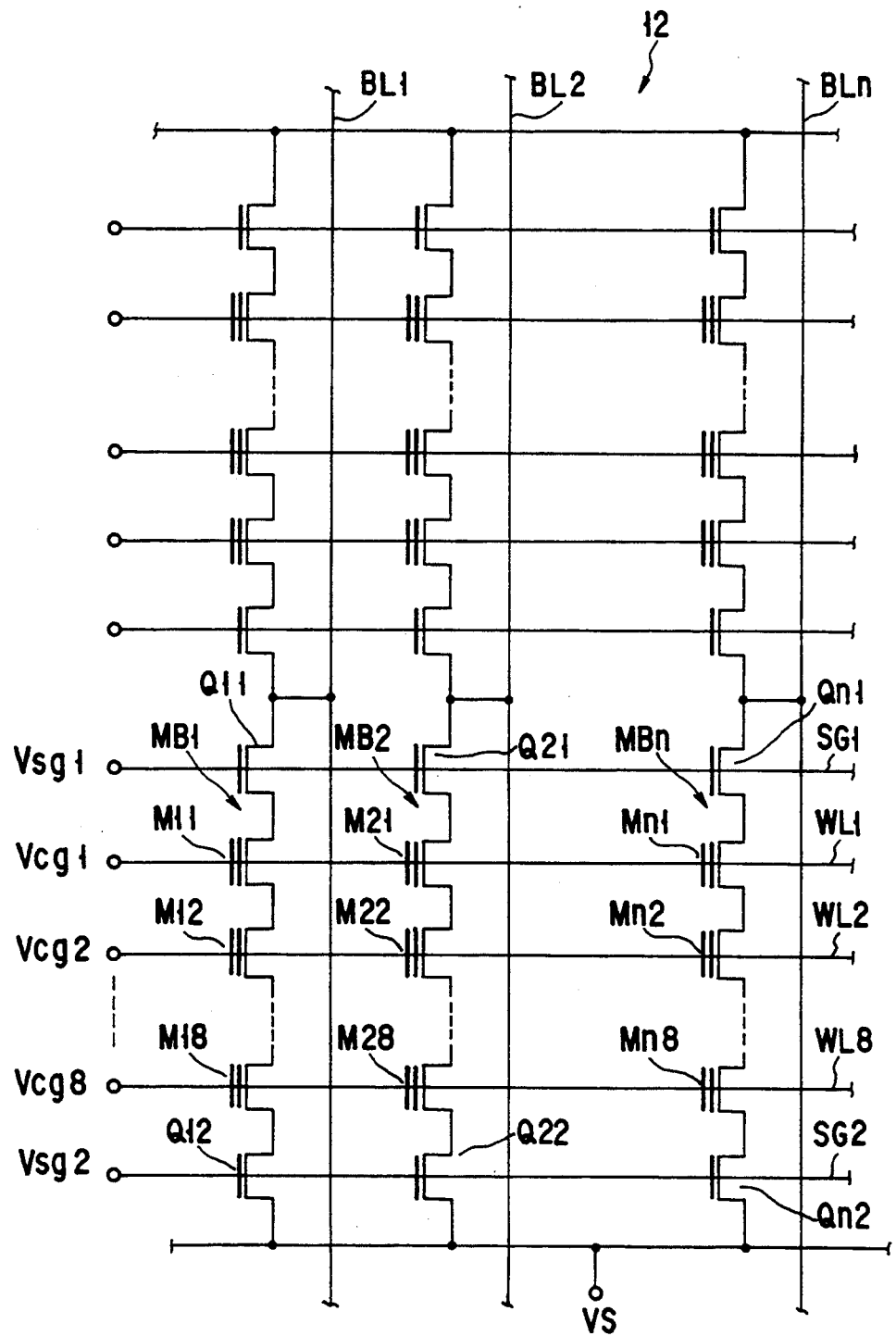
FIG. 4 is a circuit diagram of a cell array section of the EEPROM of FIG. 3.

The internal arrangement of the memory array section 22 is as follows. As shown in FIG. 4, the NAND cell type EEPROM 12 has parallel data-transfer lines BL and parallel address-control lines WL in memory section 22. Control lines WL insulatively intersect data transfer lines that are insulatively arranged on a chip substrate 40 (see FIG. 5). Control voltage signals Vcg1, Vcg2, ..., Vcg8 are applied respectively to control lines WL. The data transfer lines BL are called "bit lines"; address control lines WL are called "word lines."

Each bit line BLi (i=1, 2, ..., n) is connected to a series array MB of a predetermined number of floating gate tunneling metal oxide semiconductor (FATMOS) field effect transistors. In this embodiment, each series array MBi includes eight FATMOS transistors Mi1, Mi2, ..., Mi8 (i=1, 2, ..., n). For example, array MB1 consists of FATMOS transistors M11, M12, ..., M18. Each transistor Mij (i=1, 2, ..., n; j=1, 2, ..., 8) functions as a "memory cell" for storing a 1-bit logic data. The series array of eight memory cells is hereinafter referred to as a "NAND cell unit," and MOSFETs M are as "memory cell transistors" or simply "memory cells." The arrangement of the upper half of the memory cell matrix shown in FIG. 4 is similar to the above-mentioned one.

As is apparent from FIG. 4, the memory cell transistors Mi1, Mi2, ..., Mi8 in each NAND cell unit MBi (i=1, 2, ..., 8) are electrically connected at the control gate electrodes thereof to word lines WL1, WL2, ..., WL8, respectively. Each NAND cell unit MBi is connected to a corresponding bit line BLi through a first switching transistor Qi, which may be a metal oxide semiconductor field effect transistor or MOSFET. For example, NAND cell unit MB1 is connected to bit line BL1 through MOSFET Q11. The MOSFETs Q1 (=Q11, Q21, ..., Qn1) are commonly connected at the control gate electrodes thereof to a select gate line SG1. Each MOSFET Qi1 is selectively rendered conductive in response to a voltage signal Vsg1 supplied to control gate line SG1, causing a NAND cell unit MBi associated therewith to be electrically connected to a corresponding bit line BLi. The switching MOSFET Qi1 is referred to as a "first select transistor."

As shown in FIG. 4, the NAND cell units MB1, MB2, ..., MBn are connected to a common source voltage Vs via second switching MOSFETs Q2 (=Q12, Q22, ..., Qn2), respectively. The source voltage Vs is potentially equivalent or similar to the ground potential, which is 0 volts in this embodiment. Looking at NAND cell unit MB1 for explanation purposes only, second switching MOSFET Q12 is connected between the source electrode of a final-stage memory cell transistor M18 in the NAND cell unit and the common source voltage vs. The second MOSFETs Q2 are connected together at the control gates thereof to a second select gate line SG2. Each MOSFET Qi2 effects a switching operation in response to a voltage signal Vsg2 supplied to control gate line SG2, and when it is turned on, it electrically connects NAND cell unit MBi associated therewith to common source voltage Vs. The switching MOSFET Qi2 is hereinafter referred to as a "second select transistor."

Figure 5:
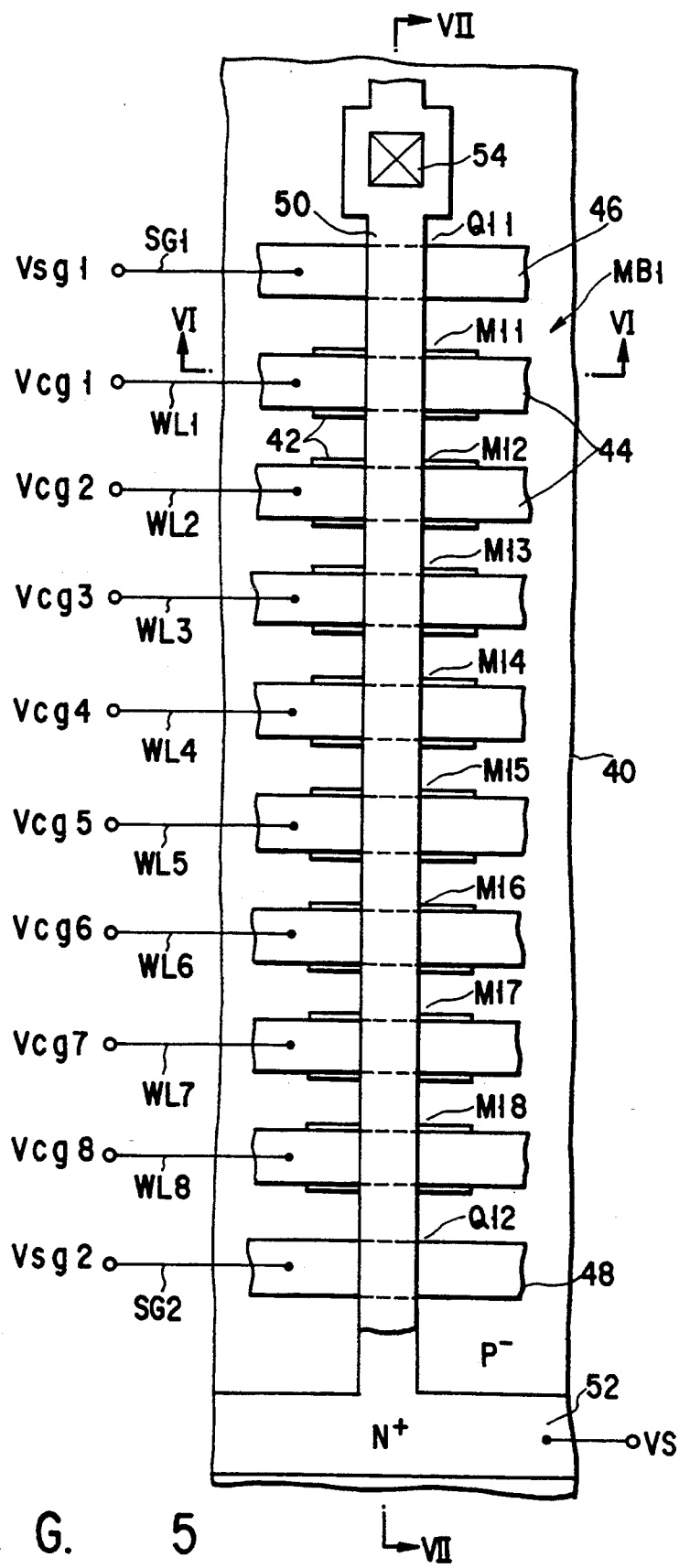
FIG. 5 is a diagram showing the plan view of a NAND cell unit in the memory array section of FIG. 4.

The plan view of eight memory cell transistors M11 to M18 of the NAND cell unit MB1 is illustrated in FIG. 5, wherein intermediate dielectric layers on or above a lightly-doped P type (P-type) substrate 40 are omitted for illustration purposes only. Each memory cell transistor Mlj (j=1, 2, ..., or 8) has a floating gate 42 that insulatively overlies P-type substrate 40. The floating gate acts as a charge storage layer. Each memory cell transistor also has a control gate electrode 44 insulatively disposed over a corresponding floating gate 42. In FIG. 5, the underlying floating gate 42 is shown to be slightly wider than control gate electrode 34. This is a mere symbolic illustration. In practice, the width thereof is substantially same as that of the overlying control gate electrode 44. First and second select transistors Q11, Q12 are arranged on both end portions of memory cell transistors M11 to M18. Select transistors Q11, Q12 each include control gate electrodes 46, 48, which will be referred to as "select gate electrodes" hereinafter.

The bit line BL1 is an elongate metal layer 50 which may be an aluminum layer. This layer extends to insulatively intersect control gate electrodes 44, first select-gate electrode 46, and second select-gate electrode 48. In FIG. 5, bit line BL1 is illustrated to be partly cut away, for convenience of illustration, to reveal an underlying heavily-doped N (N+) type semiconductor diffusion layer 52 that is formed in the surface of substrate 40. The layer 52 is kept at common source voltage Vs previously described. The first select transistor Q11 is electrically connected at its drain to bit line BL1 via a contact hole portion 54, which is formed in metal wiring layer 50 serving as bit line BL1. The second select transistor Q12 is connected at the source thereof to common source voltage Vs.

The cross-sectional structure of one (cell M11, for example) of the memory cell transistors M in NAND cell unit MB1 is shown in FIG. 6. A thin dielectric film 58 is deposited on the top surface of substrate 40. Dielectric film 58 is positioned in an element area defined by an element-separation dielectric layer 60. Dielectric layers 58, 60 may be oxide films formed by a known chemical vapor deposition technique. Dielectric film 58 serves as a gate insulation film of transistor M11. Floating gate 42 is stacked on gate insulation film 58. The length thereof is determined so that it partly covers element-separation layer 60 at its both end portions. Floating gate 42 is covered with another dielectric layer 62. Control gate electrode 44 having substantially the same width as floating gate 42 is formed on dielectric layer 62. As shown in FIG. 5, gate 42 is arranged to extend to the length corresponding to word line WL1. Floating gate 42 defines a preselected capacitance between it and substrate 40; it also defines another capacitance between it and control gate electrode 44. Control gate electrode 44 (word line WL1) is covered with a dielectric layer 64, on which metal wiring layer 50 (bit line BL1) is arranged.

The longitudinal cross-sectional structure of the NAND cell unit MB1 is illustrated in FIG. 7. A plurality of N+ type semiconductor diffusion layers 68, 70, 72, 74, 76, ..., 78, 80, 52 are arranged with a distance therebetween along the lengthwise direction of bit line BL1 on the substrate surface. N+ layer 68 serves as the drain of first select transistor Q11. As is apparent from FIG. 7, layer 68 is connected to metallic bit-line layer 50 by contact hole 54. The N+ layer 70 serves as the source of first select transistor Q11. This N+ layer 60 also serves as the drain of adjacent memory cell transistor M11. Similarly, N+ layer 52 acts as the source and drain of adjacent memory cell transistors M11, M12. N+ layer 52 functions as the source of second select transistor Q12; layer 52 is connected to common source voltage Vs, also.

Figure 8:
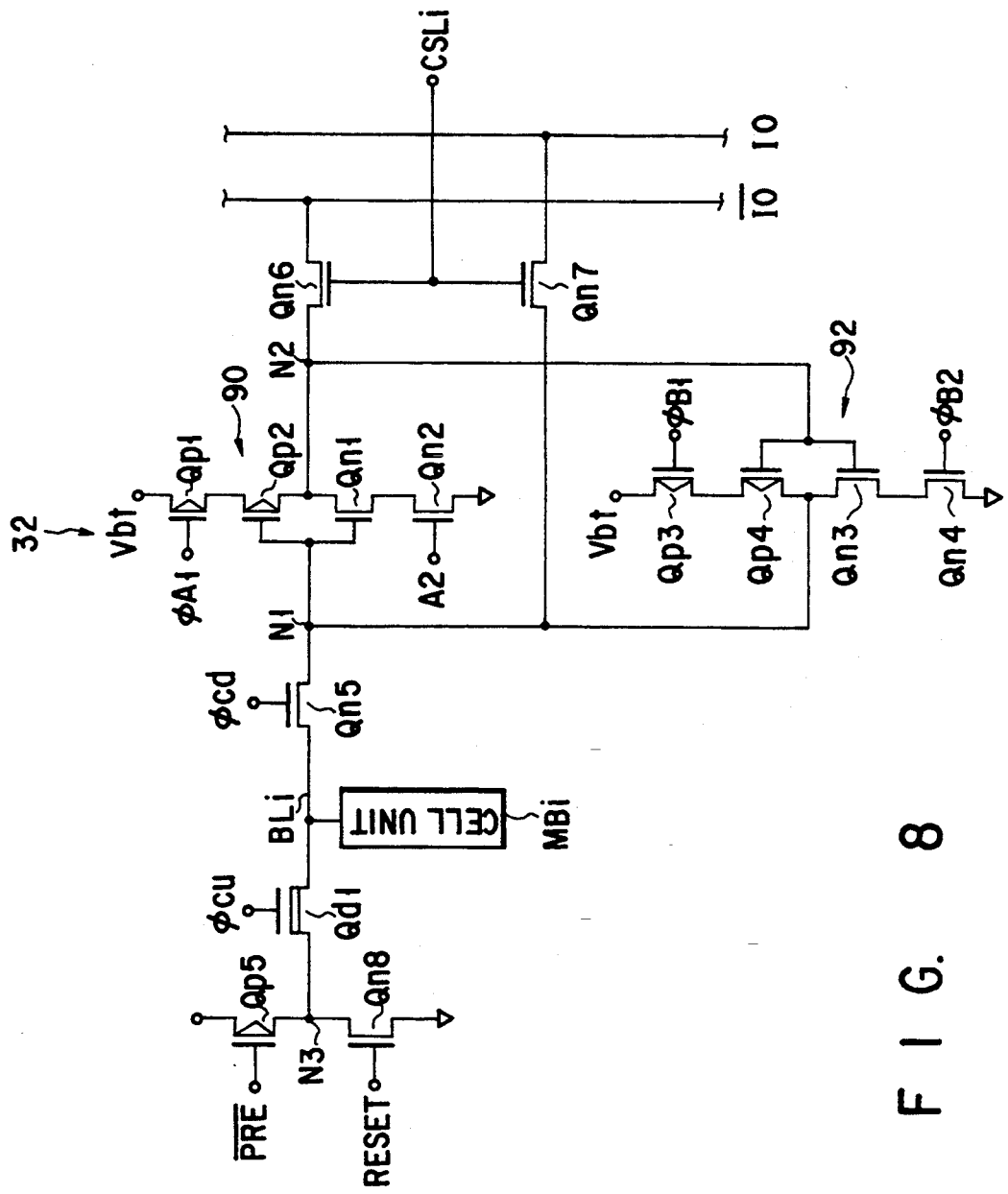
FIG. 8 is a diagram showing the internal circuit configuration of a bit-line controller shown in FIG. 3.

The characteristic feature of the bit-line controller 32 is that a couple of clock signal-synchronized inverters are employed to achieve a combined function of a data-latch and a sense amplifying function. The internal circuit configuration of bit-line controller 32 shown in FIG. 3 is as follows. As shown in FIG. 8, bit-line controller 32 includes two complementary MOS (CMOS) flip-flop circuits 90, 92 each associated with a respective one (BLi) of bit lines BL. First flip-flop circuit 0 includes P-channel MOS transistors Qp1, Qp2 of the enhancement (E) type, and E-type N-channel MOS transistors Qn1, Qn2. Second flop-flop circuit 92 includes E-type P-channel MOS transistors Qp3, Qp4 and E-type N-channel MOS transistors Qn3, Qn4.

More specifically, the MOS transistors Qp2, Qn1 of first flip-flop circuit 90 have the gate electrodes connected together. The gate electrodes are connected to a corresponding bit line BLi through an N-channel MOS transistor Qn5 serving as a transfer gate, as shown in FIG. 8. The circuit node between transistor Qn5 and flip-flop 90 is represented by "N1." Transistor Qn5 receives a clock signal $\phi$d at its gate electrode. This signal is at the high ("H") level Vh (equal to the power supply voltage Vcc; 5 volts, for example) during a read period, and becomes at an intermediate potential Vm (typically, 10 volts) during a write period. The remaining MOS transistors Qp1, Qn2 have the gate electrodes, to which control clock signals $\phi$A1, $\phi$A2 are supplied. Flip-flop 90 constitutes a clock signal-synchronized inverter.

As shown in FIG. 8, the second flip-flop circuit 92 is connected in parallel with first flip-flop circuit 90 in the opposite directions. More specifically, the gate electrodes of MOS transistors Qp4, Qn3 are connected to a common connection node N2 of the source and drain of the gate-connected transistors Qp2, Qn1 in flip-flop circuit 90. The common connection node of the source and drain of MOS transistors Qp4, Qn3 is connected to node N1. The gate electrodes of MOS transistors Qp3, Qn4 receive control clock signals $\phi$B1, $\phi$B2, respectively. Flip-flop circuit 92 constitutes another clock signal-synchronized inverter. When activated simultaneously, the two parallel-connected inverters 90, 92 perform a flip-flop operation as a data-latch. Nodes N1, N2 are coupled to data input/output lines I/O, I/O (typed as "I/O(bar)" hereinafter), respectively, through gate-coupled N-channel MOS transistors Qn6, Qn7. These transistors turn on in response to a column-select signal CSLi supplied thereto at their gate electrodes, and thus serve as data-transfer switches between the sense amplifier/data-latch circuit consisting of flip-flops 90, 92 and the input/output data lines I/O, I/O(bar).

The bit line BLi associated with the NAND cell unit MBi is connected to a source-drain connection node N3 of an E-type P-channel MOSFET Qp5 and an E-type N-channel MOSFET Qn8 via an N-channel MOS transistor Qd1 of the depression (D) type. The gate electrode of MOSFET Qd1 receives a clock signal $\phi$cu. MOSFET Qp5 is responsive to a precharge-control signal $\overline{\text{PRE}}$ (typed as "PRE(bar)" hereinafter), and functions as a precharger for bit line BLi. When precharge-control signal PRE(bar) goes to the low ("L") level potential (0 volts, for example), precharger-transistor Qp5 turns on, causing the bit line BLi to charge toward the power supply voltage Vcc (typically, 5 volts). MOSFET Qn8 is a reset transistor that is responsive to a reset-control signal RESET applied to the gate electrode thereof. When signal RESET is at the high level, reset transistor Qn8 turns on causing bit line BLi to discharge toward the ground potential. Note that transistor Qd1 acts as a high-potential protector during an erase period. By setting clock signal $\phi$cu supplied to the gate electrode of transistor Qd1 at the low level, the transistor Qd1 turns off causing MOSFETs Qp5, Qn8 to be electrically disconnected from bit line BLi. This may prevent these MOSFETs from being undesirably applied with the high level potential in an erase mode.

The bit-line controller 32 operates as follows. Assume that, in a read mode of the NAND-type EEPROM 12, when clock signals $\phi$A1, $\phi$B1 are at the high level, and clock signals $\phi$A2, $\phi$B2 are at the low level, the first and second flip-flop circuits 90 and 92 are inoperative. At this time, the column-select signal CSLi is at low level, clock signals $\phi$cd, $\phi$cu and precharge signal PRE(bar) are at high level, and reset signal RESET is at low level. The source electrode potential Vbt of MOSFETs Qp1, Qp3 in first and second flip-flops 90, 92 is kept at the power source voltage Vcc.

When the precharge signal PRE(bar) potentially drops to the low level, the bit line BLi is precharged toward power source voltage Vcc. The read process of the memory cells of NAND cell unit MBi begins after the precharge signal PRE(bar) again goes high to set word lines WL at a specific potential. Assume that the selected NAND cell unit is a unit MB1 of FIG. 4. When data is read from the memory cell transistor M18, the non-selected transistors M11, M12, ..., M17 between transistor M18 and select transistor Q11 are rendered conductive. This permits the read-out data voltage to be transmitted to the bit line BL1 through them. In accordance with the logical value of read data, i.e., a "1" or a "0," either the high or low level potential appears on bit line BL1.

Where the bit line BL1 stays high, when clock signal $\phi$A2 goes high and clock signal $\phi$B1 drops low, the read data is latched by the data-latch/sense-amplifier section (flip-flop circuits 90, 92). If bit line BL1 is at the low level, the data is latched by the same section by setting clock signal $\phi$A1 at low level, and the clock signal $\phi$B2 at high level. When column-select signal CSL1 goes high, the read data is transferred to input/output lines I/O, I/O(bar) via transfer-gate transistors Qn6, Qn7 being rendered conductive.

In a write (program) mode, the clock signal $\phi$cd first becomes at the low level, causing MOSFET Qn5 to turn on. Bit line BLi of FIG. 8 is electrically disconnected from flip-flop circuits 90, 92 serving as the data-latch/sense-amplifier section. A column-select signal CSLi is activated in response to an address specifying signal (not shown). The data is latched in the data-latch/sense-amplifier section. Clock signal $\phi$cd goes high after a one-page data (i.e., data stored in a series array of memory cell transistors associated with a selected word line) is latched, that is, after the data-latching is completed for bit lines BL1, BL2, ..., BLn of FIG. 4.

When the clock signal $\phi$cd and voltage Vbt change from Vcc to intermediate potential Vm (typically, 10 volts), bit line BLi will be at either Vm or ground potential, depending on the logical value of the write data. For each NAND cell unit MBi, select transistor Qi1 turns on, and a target cell is selected among the cell transistors of the cell unit. The non-selected cell transistors between the select transistor and the selected cell transistor are rendered conductive, thereby permitting a write data to be transferred to the selected cell. After the data write for the selected cell transistor is completed, voltages $\phi$cd, Vbt go to source voltage Vcc. At this time, clock signals $\phi$A1, $\phi$B1 are at the high level, while clock signals $\phi$A2, $\phi$B2 are at the low level. Furthermore, a reset signal RESET goes high, resetting the bit line potential. Note that, in an erase mode, clock signals $\phi$cu, $\phi$cd are forced to be at the low level, causing MOSFETs Qn5, Qd1 to turn off. Bit-line controller 32 is disconnected from bit line BLi of FIG. 8.

The main feature of the IC card module 10 including EEPROMs 12 lies in the highly reliable technique of controlling the threshold value of memory cell transistors in a write-verify operation. More specifically, after the selected cell is programmed, the actual threshold value thereof is evaluated by applying a specific verify voltage to the control gate line (word line) connected to this cell; rewrite and verify operations are repeated until the resultant threshold value is assured to be within the allowable range for all memory cell transistors connected to the word line. Such a "write/verify threshold value" control is performed by the controller 14, which is built together with the EEPROMs 12 in the IC card 10 of FIGS. 1 and 2, although the task of controller 14 may be carried out by a CPU (not shown) of an external digital computer system.

Figure 9:
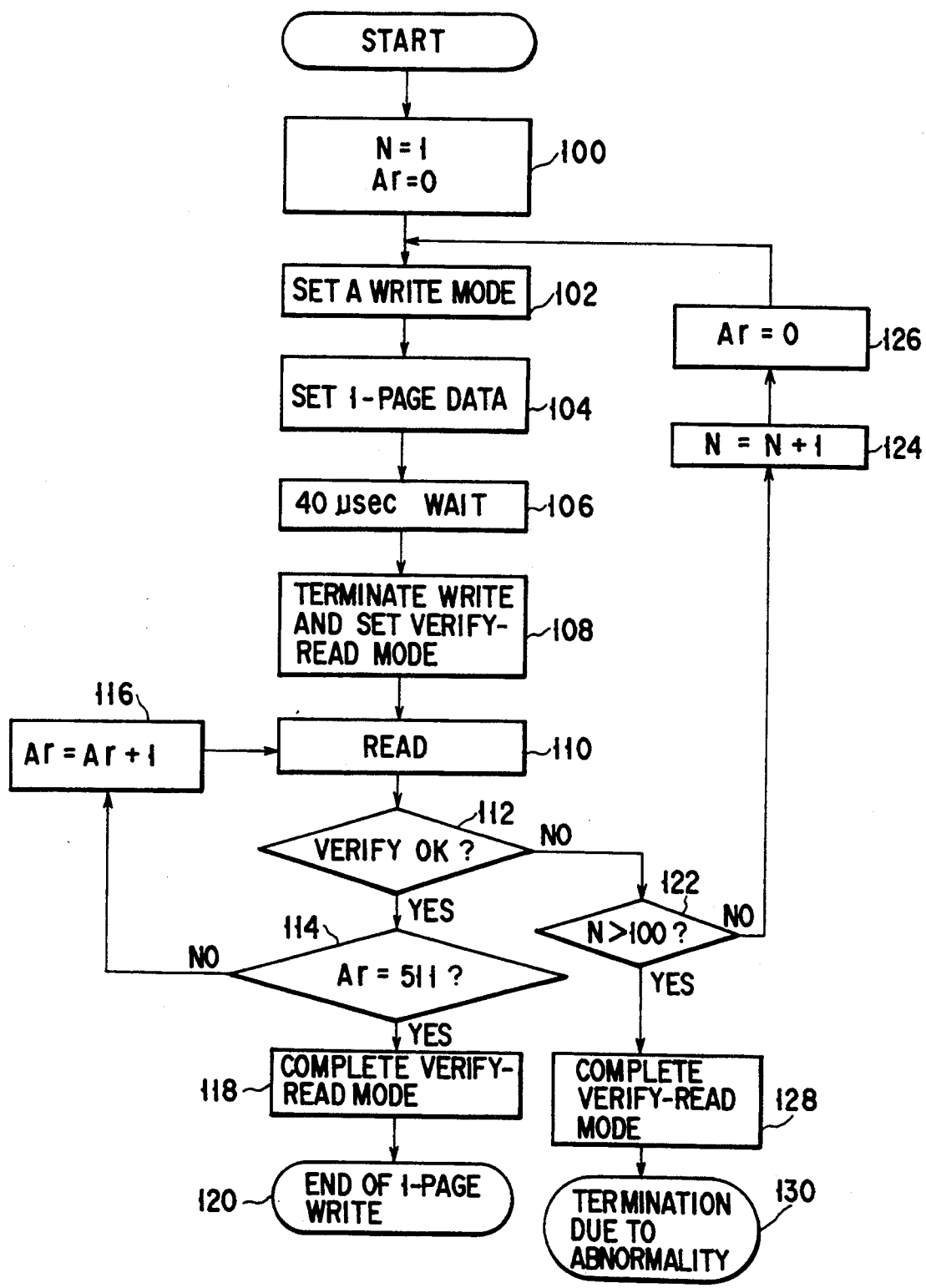
FIG. 9 is a flowchart for a write operation of the EEPROM.

The "write/verify threshold-value control" process of the invention may follow the sequence of steps shown in FIG. 9. Assume, for the purpose of convenience of explanation, that the number of memory cell transistors arranged along each control gate line (word line WL) of FIG. 4 is 512 (n=512), where the column addresses starts with 0, 1, ..., up to 511. These cell transistors constitute "one page." The flowchart shows the fundamental algorithm for the one-page data in the case of repeating the write-verify and rewrite (reprogram) operations in the page mode with 40 microseconds being as a unit write time.

When a write operation starts in the EEPROM 12, an internal parameter N indicating the number of data writes is set to 1 (N=1) at step 100. Also, the read address Ar for one page is set to 0 (Ar=0). At step 102, the write mode is set. At step 104, a one-page data is set. At step 106, the "wait" state is maintained in response to the 40-microsecond write-pulse signal, during the writing (programming) of the one-page data.

After the writing is completed, the EEPROM 12 is set to the write-verify mode under the control of the controller LSI 14 at step 108. At step 110, the data bits of the one page just written in the target memory cell transistors are sequentially read out. At step 112, these cell transistors are subjected to the verify processing, which is the step to check to determine if the resulting written state (changed in threshold value) in the target cell transistors is potentially sufficient.

If it is verified at step 112 that the write state is potentially sufficient, the control proceeds simply to the next step 114, where it is judged whether or not the intra-page read address Ar—the address of the cell to be read from among the array of the selected cell transistors forming the "one page"—has reached 511 already. If Ar<511, then the read address Ar is incremented by one at step 116, and control returns to step 110. After steps 112 and 114 have been repeated, the address check processing of step 114 is performed again. The processes of steps 116, 110, 112, and 114 will be repeated smoothly as long as the read-verify goes successfully through the one-page data. Once it is affirmed that the read address Ar has reached "511," the read routine for write-verify is terminated at step 118 to exit the verify mode. The write operation of one-page data is completed at step 120.

Generally, however, such a "lucky" case is rare. The reason has been already described in the introductory part of the description. The following explanation will focus on a case where a complete or potentially sufficient write state cannot be obtained by only one write operation at some of 512 read addresses.

When the verification at step 112 judges the write state to be insufficient, the control proceeds to a special subroutine unique to the present invention, along a line indicated by "NO" in FIG. 9. First, at step 122, it is judged whether or not the data write execution number N reaches a predetermined value (100 in this embodiment). Because this is the first time to move to the subroutine, this step naturally gives K<100, with the result that the control goes to step 124 along the processing line labeled "NO." At this step, the write execution number N is incremented by one (N=N+1). At step 126, the intra-page read address Ar is reset to zero. The write-mode setting of step 102 is executed; thereafter, the write (rewrite) operation of steps 104, 106, and 108 is executed. At step 110, the written data is read out and the resulting write state is checked at step 112. If it is verified that the state becomes satisfiable by the execution of the rewrite operation, the control will proceed to step 114. Alternatively, if the write state is unsatisfactory even after the rewrite operation was executed, the control would pass through steps 122, 124, 126, and the write operation of steps 102, 104, 106,108 will be repeated.

The repetition of these steps will continue until the judgment at step 112 returns the affirmative answer, "YES." The number of repetitions is however limited to a value less than "100." For a certain reason, such as incurable physical defects in memory cell transistors, if as many as 100 times of rewrite processes still fail to provide a satisfiable write state, it will be judged that a writing malfunction has occurred. In such case, the verify-read process will be forced to terminate at step 128, and the processing of this routine will be stopped at step 130. A subsequent process would be taken over by a routine that should be determined by the system designer or end users.

When the repetition of the above processes shows that the write state is good for a certain address of the one-page data array, similar processes are performed on the subsequent address bit for at least one time. Such processes are repeated until the resulting write state is verified to be satisfiable for all 511 address bits. Once the write state is judged to be acceptable for the one-page data array, the write/verify threshold-value control process is terminated.

With the embodiment, the write-verify process is carried out immediately after the data was written in the presently specified memory cell transistor during the program operation of the selected NAND cell unit in the page mode. This allows any changes in the threshold value of the programmed memory cell to be evaluated in sequence. The evaluation is performed by applying the verify voltage of a predetermined potential (typically, an intermediate voltage between the power source voltage Vcc and the ground potential) to the memory cell transistor and then measuring the actual threshold value (for verify reading) after the cell was programmed. Using the one-page data array as a unit, the threshold evaluation is repeated for the memory cell transistors in the unit. Whenever any insufficiently written cell, or any FATMOS cell transistor whose actual threshold value change is insufficient although the data has been written therein, is found, a write operation will be additionally performed on the cell. Depending on the situation, the rewrite and read-verify are repeated in the range of a predetermined number of times until the sufficiently written state is verified with respect to all addresses for the one-page data bits. This can remarkably improve the write-operating reliability without adding any extra circuits even in NAND-cell type EEPROMs that vary in characteristics from one memory cell to another.

Figure 10:
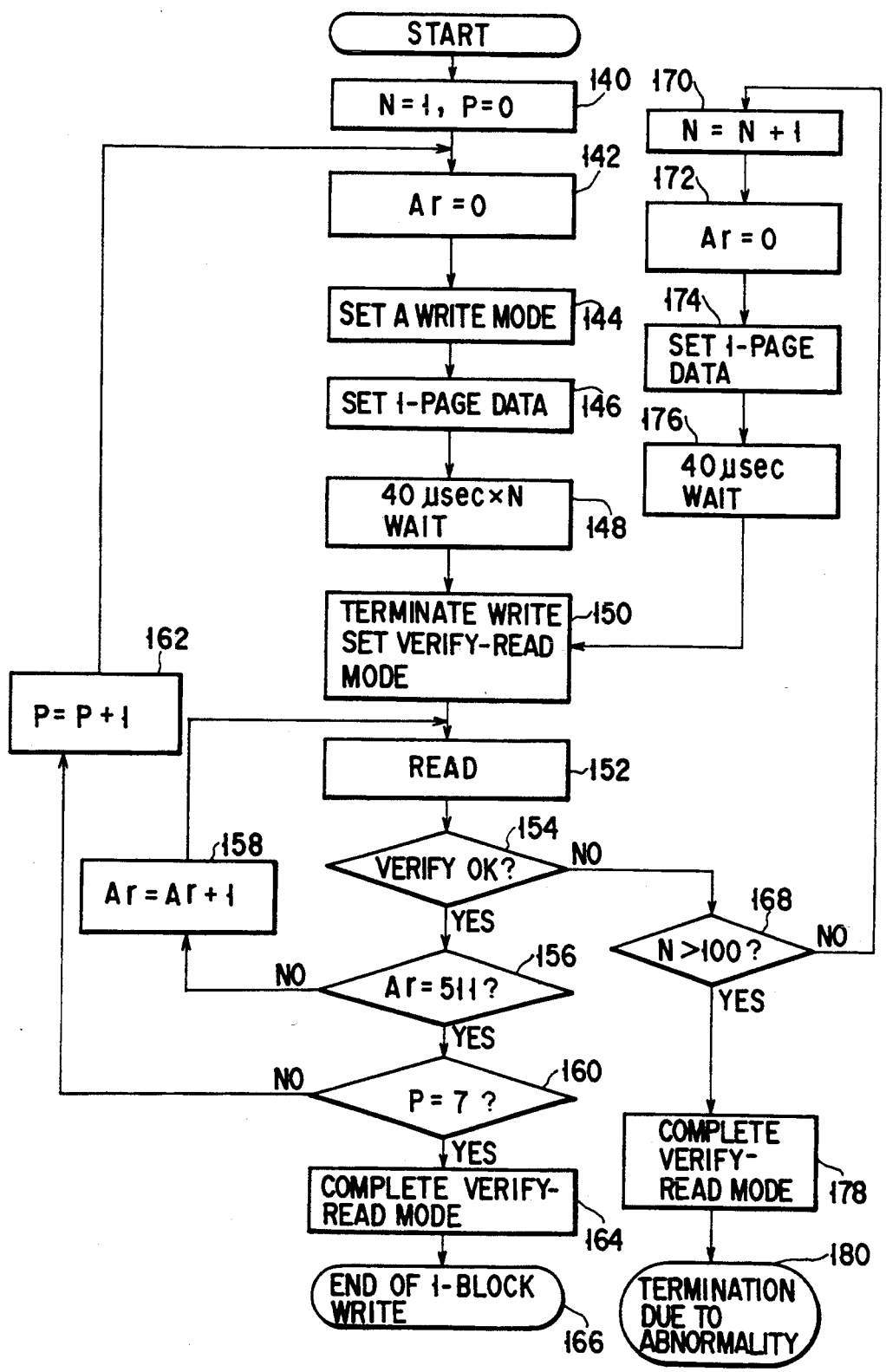
FIG. 10 is a flowchart for another write operation of the EEPROM.

The process flow shown in FIG. 10 is superior to that of FIG. 9 in that a highly efficient total verifying process is achieved by suppressing or minimizing the waste execution of rewrite/verify operations. This will be explained in detail below. The following explanation is made under an assumption that the FIG. 10 embodiment performs the write/verify threshold-value control operation on one block of NAND cell units MB, i.e., those associated with bit lines BL1 to BLn of FIG. 4.

Firstly, at step 140 of FIG. 10, the writing number N is initialized to "1" and the page number P (assumed to take 0 to 7) is reset to zero. At step 142, the address Ar is initialized to zero. At step 144, the write (program) mode is set. At step 146, one-page data is set. At step 148, during the programming of one-page data, the wait state is maintained for N times as long as 40 microseconds. After the write operation is completed, EEPROM 12 is set in the write/verify mode under the control of the controller LSI 14 at Step 150. The process at this step is similar to that of step 108 of FIG. 9. The subsequent steps 152, 154, 156, 158 are similar to steps 110, 112, 114, 116 of FIG. 9.

After the acceptability of the resultant write state is verified at step 156 of FIG. 10, control proceeds to step 160. At this step, it is judged whether or not the page number P has reached "7." If P<7, step 162 carries out the operation P=P+1 and returns control to step 142. If P=7, the read routine for write-verify is completed at step 164, and the verify mode is terminated. The writing of one-page data is now finished at step 166.

If the writing is judged to be insufficient by the verification at step 154, control will go to the write compensation subroutine along the line labeled "NO" in the FIG. 10. First, at step 168, it is judged whether or not the write number N has reached a predetermined number (100 is set in this embodiment as in the preceding embodiment). Since this is merely the first transfer to the subroutine, the result at this step is naturally N<100, control proceeds to step 170 along the processing line labeled "NO." At this step, the number N is incremented by one (N=N+1). At step 172, the intra-page read address Ar is reset to "0." At step 174, one-page data is set. At step 176, during the writing (programming) of one-page data, the wait state is kept only for 40 microseconds and control passes to step 150.

If a satisfactory result cannot be obtained even after the write/verify processes at steps 150, 152, 154 are repeated for the N (100) times, the process is forced to terminate at step 178. Then, at step 180, this routine is terminated under an assumption that a write malfunctioning occurs.

Very importantly, at step 148, the write-wait time is set to N times (N is the write number) 40 microseconds. This means that the total write time required to write data in the "i"-th page is employed as the initial write time needed to write data in the "i+1"-th page. For example, assuming that the rewrite operation is performed 50 times in the threshold value verification for the first page data, the repetitions of rewriting is being counted up in real time, and the resulting count value (the number of rewrites) is stored. When control passes through steps 156, 160, 162, 142, 144, 146 and reaches step 148, the write wait time is set to 40 microseconds × the above count (=50) from the beginning. That is, the initial rewrite wait time for the second page is extended to 40×50 microseconds. The wait-time adjustment is done under an assumption that the physical state of the cell unit being processed is similar to those of adjacent cell units. (The rightness of such assumption may be proved by the experimentally created rule that physical variations between cell blocks on a chip substrate is generally smaller than those between chip substrates even if a variation occurs in the threshold values of the memory cells in the EEPROM chip during the manufacture thereof.) Using a specific scheme that the data write time for the currently designated page is determined by storing and utilizing the write number N for the preceding page data, it becomes possible to minimize wasteful repetitions of rewrite/verify process to guarantee a properly written state, thereby reducing the total write time in EEPROMs in most cases.

The following table shows a list of the potential levels of the voltages applied to the main portions of the EEPROM 12 during the aforementioned write/verify period. The table assumes that a row of memory cells along a word line WL2 is selected in the cell matrix configuration of FIG. 4.

TABLE

|  | Erase | 1-Write | 0-Write | Write-vertify | Read |
|---|---|---|---|---|---|
| Bit Line | — | 0 V | 10 V | 5 V | 5 V |
| SG1 | 0 V | 10 V | 10 V | 5 V | 5 V |
| WL1 | 0 V | 10 V | 10 V | 5 V | 5 V |
| WL2 | 0 V | 20 V | 20 V | 0.5 V | 0 V |
| WL3 | 0 V | 10 V | 10 V | 5 V | 5 V |
| WL4 | 0 V | 10 V | 10 V | 5 V | 5 V |
| WL5 | 0 V | 10 V | 10 V | 5 V | 5 V |
| WL6 | 0 V | 10 V | 10 V | 5 V | 5 V |
| WL7 | 0 V | 10 V | 10 V | 5 V | 5 V |
| WL8 | 0 V | 10 V | 10 V | 5 V | 5 V |
| SG2 | 0 V | 0 V | 0 V | 5 V | 5 V |
| Source | — | 0 V | 0 V | 0 V | 0 V |
| Substrate (or Well) | 20 V | 0 V | 0 V | 0 V | 0 V |

While the threshold evaluation reference value in verify operation is 0.5 V in the previously described write/verify threshold-value control operation, the value is a mere example. The same goes with the setting of the unit write time to 40 microseconds. If more precise final adjustment of threshold value is required, the unit write time may be made shorter to execute the rewrite/verify operation at shorter intervals. On the other hand, if high-speed performance is more critical, the unit write time may be set to a value longer than 40 microseconds. Note that the steps 126, 127 in FIGS. 9 and 10 may be omitted if the speed-up of the process execution is required more strongly.

Figure 11:
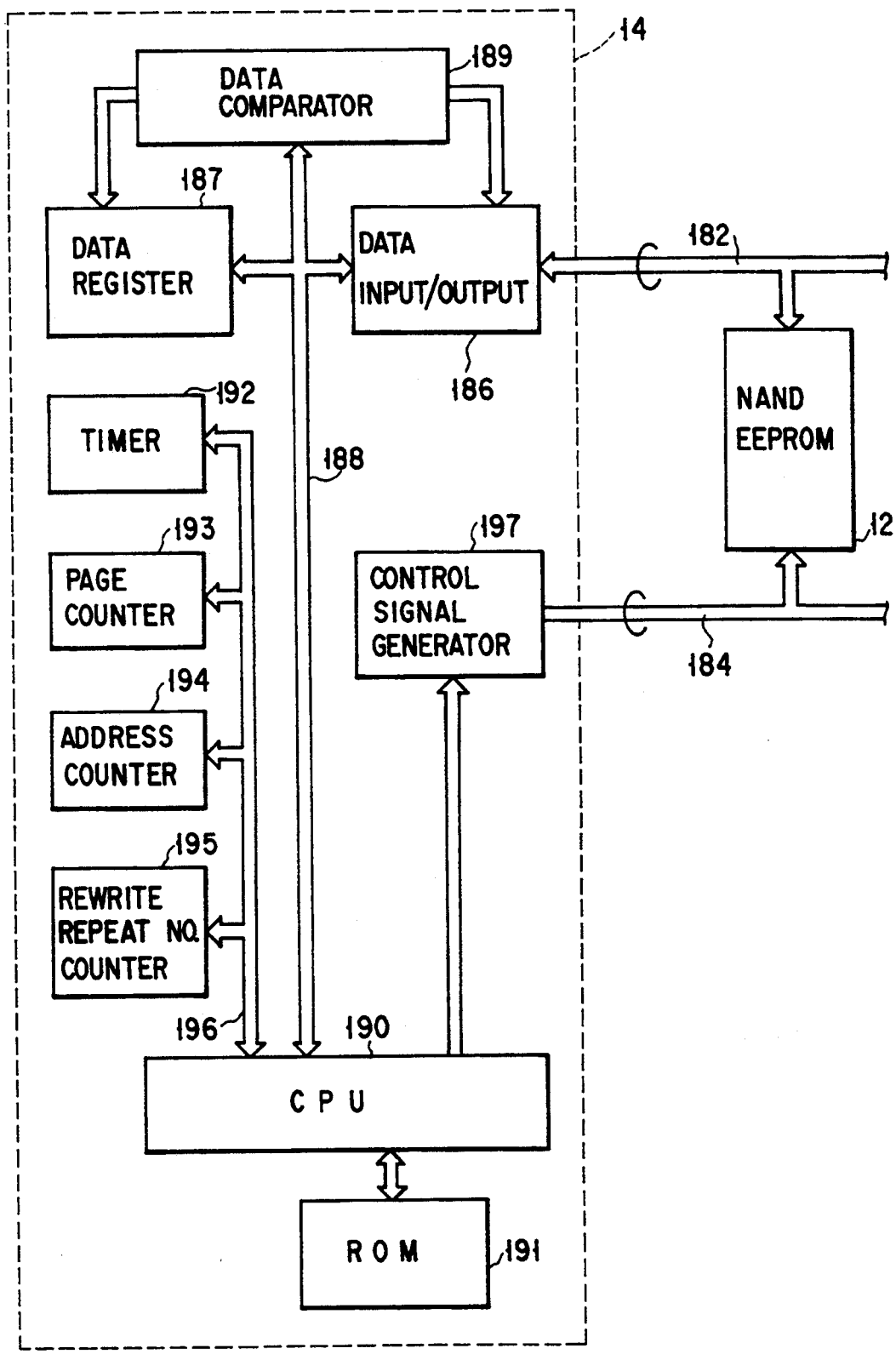
FIG. 11 is a block diagram showing the internal arrangement of an exemplary controller LSI suitable for achieving a "write/verify threshold-value controlling" function shown in FIG. 9 or 10.

FIG. 11 illustrates the internal hardware configuration of an exemplary controller LSI 14 that can successfully achieve the write/verify threshold-value control operation of FIG. 9 or 10. Controller LSI 14 is associated with NAND-type EEPROMs 12 (only one of them is visible in FIG. 11) via a data bus 182 and a control signal transmission bus 184. Controller 14 includes a data input/output circuit 186, which is coupled to data bus 182. A data register 187 is associated with circuit 186 via an internal bus 188. Data register 186 has a capacity for storing one block of data bits in EEPROM 12. A data comparator circuit 189 is connected to both circuits 186, 187. During the write/verify period, circuit 189 compares the output data of circuit 186 with the data stored in register 187. Internal bus 188 is connected to a central-processing unit (CPU) 190. CPU 190 is connected to a read-only memory (ROM) 191, wherein the algorithm software of the write/verify threshold-value control operation is written in microcodes.

As shown in FIG. 11, the controller LSI 14 includes a timer circuit 192, a page counter circuit 193, an address counter circuit 194, and a counter 195 that counts the number of rewrite operations. These circuits are associated with CPU 190 via another internal bus 196. A control signal output circuit 197, which is connected to CPU 190, supplies address signals including $\overline{WE}, \overline{OE}, \overline{CE}$, via an external bus 184, to EEPROMs 12 of FIG. 2 under the control of CPU 190.

The timer 192 manages the length of the unit write execution time (write wait time) described above in the write/verify threshold-value control in FIG. 9 or 10. Page counter 193 serves to manage the page number by counting up the page number of page data sequentially specified. Address counter 194 counts the memory cell addresses sequentially selected. Counter 195 counts up the number N at step 124 of FIG. 9 (or at step 170 of FIG. 10), and at least temporarily hold it therein. This function becomes useful especially in the operation of the embodiment of FIG. 10, because the previously explained "rewrite wait time adjustment" feature unique to the FIG. 10 embodiment stems from the cooperation with counter 194. CPU 190 performs an overall control of the components 186, 187, 189, 192 to 195, and 197 in the aforementioned manner in accordance with the algorithm of ROM 191. Note that, with the construction of the controller disclosed here, the erase/write operation will be automatically performed within the block upon reception of an external block address signal and a corresponding block of data are supplied. Data communication with EEPROMs 12 is performed with a plurality of NAND cell units forming one block being as a unit, in response to an external block address signal.

Figure 12:
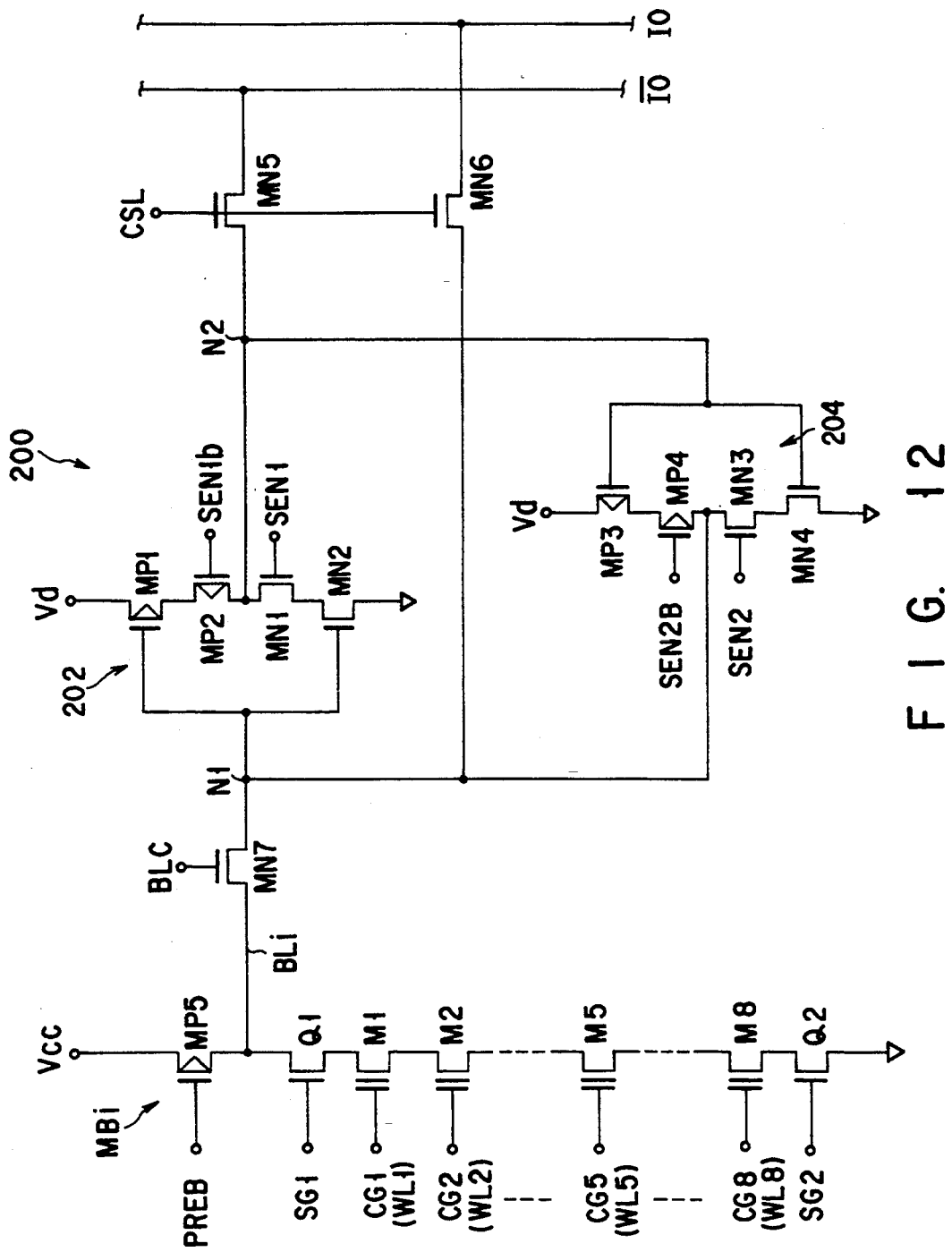
FIG. 12 is a circuit diagram of one possible modification of the bit-line controller of FIG. 8.

The bit-line controller 32 of FIG. 8 may be modified as shown in FIG. 12; the resulting controller can additionally provide unexpected results, i.e., the possibility of suppressing or eliminating the occurrence of errors in successive data read operations. This will be explained in detail below.

As shown in FIG. 12, a bit-line controller (sense amplifier circuit) 200 is associated with a bit line BLi connected to an NAND cell unit MBi. In this embodiment, each bit line BLi is provided with a sense amplifier circuit 200. The memory cell transistors in NAND cell MBi are simply indicated by M1, M2, ..., M8, and the first and second select transistors are denoted by Q1 and Q2. Bit-line controller 200 includes a sense amplifier circuit, which includes a first and second clock-synchronized inverter circuits 202, 204.

The first inverter 202 is a C$^2$MOS inverter that includes a series circuit of PMOS transistors MP1, MP2 and NMOS transistors MN1, MN2. Transistors MP1, MN2 have the gate electrodes connected together at a circuit node N1. Node N1 is a data input terminal. The common drain of the remaining transistors MP2, MN1 is connected to a node N2, which is a data input terminal. Transistors MP2, MN1 are controlled by clock signals SEN1B, SEN1. Similarly, second inverter 204 is a C$^2$MOS inverter composed of a series circuit of PMOS transistors MP3, MP4 and NMOS transistors MN3, MN4. Transistors MP3, MN4 have gate electrodes connected together at node N2. The common drain of the remaining transistors MP4, MN3 is connected to node N1. Transistors MN4, MN3 are controlled by clock signals SEN2B, SEN2.

The node N2 is connected to input/output data line I/O through a transfer-gate NMOS transistor MN5, whereas node N1 is connected to input/output data line I/O(bar) via a transfer-gate NMOS transistor MN6. Transistors MN5, MN6 serve as column gates that receive a column-select signal CSLi at their gate electrodes. An NMOS transistor MN7 is arranged between bit-line controller 200 and a corresponding bit line BLi, and acts as a transfer gate. A PMOS transistor MP5 is connected between power supply voltage Vcc and bit line BLi. Transistor MP5 functions as a precharger that responds to precharge control signal PREB.

Figure 13:
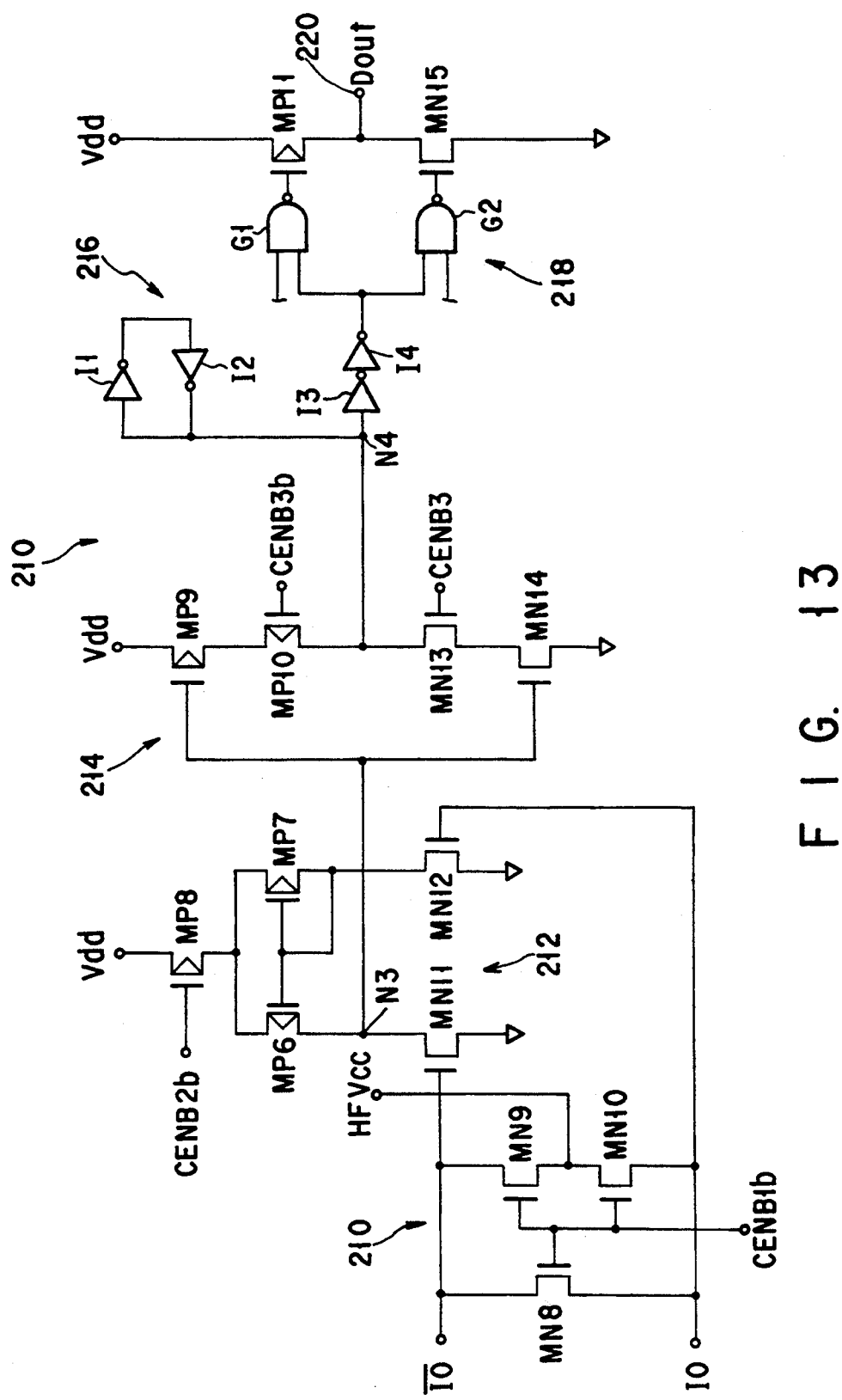
FIG. 13 is a diagram showing a peripheral data-read circuitry associated with the controller of FIG. 12.

The I/O, I/O(bar) lines are provided with an equalize circuit 210 and a current-mirror type differential amplifier circuit 212 shown in FIG. 13. Equalizer 210 includes three NMOS transistors MN8, MN9, MN10. Differential amplifier 212 includes driver NMOS transistors MN11, MN12, PMOS transistors MP6, MP7 serving as current-mirror loads, and a current-source PMOS transistor MP8. A node N3 between transistors MP6, MN11 is the output terminal of the differential amplifier.

As shown in FIG. 13, a clock signal-synchronized inverter 214 is coupled to the output node N3 of the differential amplifier. Inverter 214 is a C$^2$MOS inverter composed of a series circuit of PMOS transistors MP9, MP10 and NMOS transistors MN13, MN14. Transistors MP9, MN14 have gate electrodes connected together at node N3. The common drain of the remaining transistors MP10, MN13 is connected to a node N4. Transistors MP10, MN13 are controlled by clock signals CENB3b, CENB3. The output terminal of inverter 214 is connected to a data latch circuit 216 composed of two inverters I1, I2, which are connected in parallel with each other in the reverse directions. The output of data latch 216 is connected to an output buffer circuit 218, which includes a series circuit of inverters I3, I4, NAND gates G1, G2, a PMOS transistor MP11, and an NMOS transistor MN15. The output data (read-out cell data) Dout appears at an output terminal 220.

The read operation of the sense amplifier circuit is as follows. When EEPROM 12 is set in a read mode, the first clock signal-synchronized inverter 202 is activated prior to the activation of second inverter 204 in bit-line controller 200 of FIG. 12. Second inverter 204 is then activated with a specified time delay. For this delayed activation control, the system control is made so that a certain delay $\tau$ in timing may occur between potential changes of clock signals SEN1B, SEN1 10 and those of clock signals SEN2B, SEN2, as will be described in detail below.

The read operation begins when a transition of row address is detected by a known address transition sensing circuit (not shown) to produce a corresponding sensing pulse TRDR. This time point is expressed by "t0" in FIG. 14. At time t1, clock signals SEN1, SEN2 supplied to sense amplifier 200 of FIG. 12 potentially drop from the high level to low level. Simultaneously, clock signals SEN1b, SEN2b rise from low level to high level. Sense amplifier 200 (i.e., first and second inverters 201,204) are thus made inactive. Such inactivation is for eliminating unwanted current flow through sense amplifier 200 during a subsequent precharging of bit line BLi.

Figure 14:
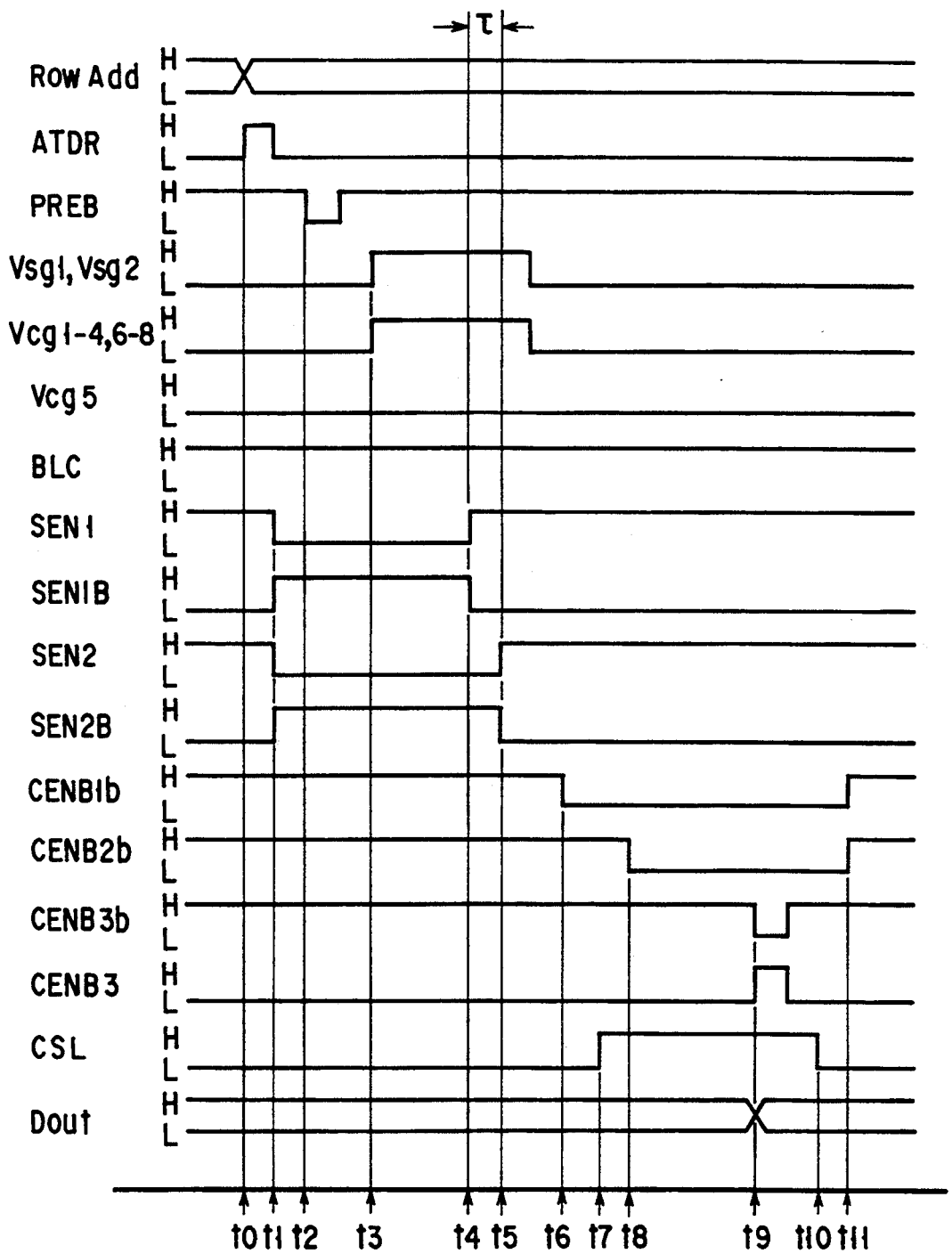
FIG. 14 is a diagram illustrating the main potential changes at the main portions of the bit-line controller of FIG. 13 during a read period.

Subsequently, as shown in FIG. 14, the clock signal PREB goes to the low level at time t2, causing PMOS transistor MP5 of FIG. 12 to turn on. The power supply voltage Vcc is applied to bit line BLi via transistor MP5 to precharge it toward Vcc. It may be considered that preparation for data read is completed at this stage.

For convenience of explanation, assume that a word line WL5 is selected in the memory cell array section including the NAND cell units MB. At time t3, first and second select gate voltages Vsg1, Vsg2 (see FIG. 4) go high, and the voltages Vcg1 to Vcg4 and Vcg6 to vcg8 of the non-selected word lines WL1–WL4, and WL6–WL8 also go high. Voltage Vcg5 on the selected word line remains at the low level (=Vss). When the selected cell M5 of FIG. 12 is negative in threshold value, a cell current flows from NAND cell unit MBi to a corresponding bit line BLi. Bit-line potential Vbit changes at the low level. When the selected cell M5 has a positive threshold value, no cell current flows. The bit-line potential stays high.

Subsequently, at time t4, only clock signals SEN1, SEN1b change in their potential levels; in other words, SEN1 rises to the high level, and SENb drops to the low level. At this time, clock signals SEN2, SEN2b remain potentially unchanged. This results in that, while second inverter 204 is made inactive, first inverter 202 is activated. The potential at output node N2 of first inverter 202 is determined in accordance with the logical value ("1" or "0") of the data read from the selected cell. It should be noted that during this operation, second inverter 204 is kept inactivated.

At time t5 delayed from the time t4 by time lag $\tau$, clock signal SEN2 goes high and clock signal SEN2b is at the low level. Here, second inverter 204 is activated for the first time. A sensed data voltage is latched. The technique for activating first and second inverters 202, 204 with a delay therebetween may prevent the both potentials at input node N1 and output node N2 from rising to the high level simultaneously. This can almost perfectly protect the read operation of the presently selected memory cell from an adverse effect of the residual potential in the preceding read cycle for another memory cell. Therefore, the data sense operations can be further enhanced. Especially, it is possible to prevent the occurrence of errors previously found in the successive read mode in NAND cell units, thereby improving the reliability of read operations.

In the above embodiment, the sense amplifier circuit 200 is arranged for each bit line BLi. After a similar read-data latch is completed for bit lines BL1, BL2, ... , BLn associated with the selected word line WL5, one page of memory cell data is obtained. One data bit selected from the one-page data bits, which corresponds to the selected column address, is transferred to the I/O, I/O(bar) lines as follows.

At time t6 of FIG. 14, clock signal CENB1b drops to the low level, rendering the equalizer 210 of FIG. 13 inoperative. Since signal CENB1b remains high until time t6, equalizer 210 is operative, so that the I/O, I/O(bar) lines are equalized toward precharge potential HFVcc, for example, Vcc/2. Turning off equalizer 210 permits I/O, I/O(bar) lines to be in an electrically floating state.

At time t7, column gates corresponding to the selected column (MN5, MN6, for example) turn on. Depending on the latched data, a certain potential difference appears between the I/O, I/O(bar) lines. At time t8, clock signal CENB2b changes from high level to low level, activating current-mirror differential amplifier 212. At time t9, clock signal CENB3 goes high, and clock signal CENB3b becomes at the low level, activating inverter circuit 214. The output of differential amplifier 212 is transmitted via inverter 214 to output buffer 218, and finally appears at output 220 of FIG. 13.

Thereafter, the inverter circuit 214 is again rendered inactive, and the data at this time is latched by latch circuit 216. Latch circuit 216 holds the output data during from the time when inverter 214 associated therewith becomes inactive until it is activated again in the next read cycle. The data holding by latch 216 serves to suppress the application of external noises to output 220. Since latch circuit 216 is designed to have a relatively low current drivability, the latched data may be easily modified as required (for example, when inverter 214 at the pre-stage is activated).

At time t10, column select signal CSL is at the low level, which forces column-gate transistors MN5, MN6 of FIG. 12 to turn off. The column gates close. When clock signal CENB2b goes high at time t11, differential amplifier 212 is inactivated. Simultaneously, clock signal CENB1b goes high. The I/O, I/O(bar) lines are potentially equalized, which completes the read cycle. 10 The present invention is not limited to the above-described specific embodiments and may be practiced or embodied in still other ways without departing from the spirit or essential character thereof.

What is claimed is:

1. A non-volatile semiconductor memory system comprising:
   a memory cell array including rows and columns of electrically erasable and programmable memory cell transistors;
   write means for selecting from said memory cell transistors a first sub-array of memory cell transistors corresponding to one page, and for programming the first sub-array;
   write-verify means for verifying the electrical written state of the selected memory cell transistors by checking their threshold values for variations, and for, when any insufficiently written cell transistor remains among them, repeating a rewrite operation using a predetermined voltage for a predetermined period of time so that the written state comes closer to a satisfiable state; and
   said write-verify means comprising means for counting repetitions of the rewrite operation performed on said first sub-array of memory cell transistors until said written state is sufficiently close to said satisfiable state, producing a count value corresponding to the number of times that said rewrite operation is repeated until said satisfiable state is attained, and employing said count value in executing a write operation for a second sub-array of memory cell transistors corresponding to a second page such that the write operation executed for said second sub-array is automatically repeated a fixed number of times corresponding to said count value.

2. A system according to claim 1, wherein said write-verify means performs each rewrite operation by applying said voltage to the insufficient cell transistor for a predetermined period of time.

3. A system according to claim 2, wherein said write-verify means repeats the rewrite operation on said insufficient cell transistor until the written state reaches the satisfiable state.

4. A system according to claim 2, wherein said write-verify means repeats the rewrite operation on said insufficient cell transistor in the range of a preselected number of times.

5. A system according to claim 1, wherein each of said memory cell transistors includes a gate-insulated field effect transistor having an insulated carrier-storage layer, which is selectively charged or discharged by allowing charge carriers to flow into or from the carrier-storage layer, thereby changing the threshold value of the field effect transistor.

6. A system according to claim 5, further comprising:
   first insulated parallel lines associated with either ones of said rows and columns of memory cell transistors, for serving as data transfer lines;
   second insulated parallel lines associated with the remaining ones of said rows and columns of memory cell transistors, for functioning as program lines; and
   said sub-array forming one page including those memory cell transistors associated with one of said second lines.

7. A system according to claim 6, wherein said field effect transistor includes a floating-gate tunneling metal insulator semiconductor transistor.

8. A device according to claim 1, wherein said write-verify means is mounted on a separate semiconductor integrated circuit chip substrate.

9. A device according to claim 8, wherein said chip substrate is built in a card-shaped solid-state portable structure.

10. A device according to claim 9, wherein said electrically erasable and programmable memory cell transistor includes a floating-gate tunneling metal oxide semiconductor field effect transistor.

11. An electrically erasable and programmable read-only memory device comprising:
   a semiconductive substrate;
   an array of rows and columns of memory cells on said substrate, each of said memory cells including an insulated-gate transistor with a carrier-storage layer, said memory cells being divided into a plurality of cell groups each of which includes a series array of memory cells;
   data transfer lines associated with columns of memory cells;
   control lines insulatively crossing said data transfer lines above said substrate, and being associated with the rows of memory cells;

program means connected to said control lines, for selecting a first of said control lines, and for simultaneously programming selected memory cells associated with the selected first control line in accordance with data bits supplied from those of said data transfer lines connected to said selected memory cells;

write-verify means for verifying the electrical write state of said selected memory cells by checking threshold values of said selected memory cells for variations, and for, when any insufficiently written memory cells remains among said selected memory cells, performing a rewrite operation by additionally programming the insufficiently written memory cell using a predetermined write voltage and then rechecking the resulting write state so that the write state of said insufficiently written memory cell comes closer to a reference state, and for repeating said rewrite operation if the resulting write state does not come sufficiently close to said reference state;

storage means associated with said write-verify means, for detecting the total number of the rewrite operations performed with respect to the insufficiently written memory cell, and for storing said total number as a program execution number; and write adjuster means connected to said storage means and said write-verify means, for when a second control line is selected, and if an insufficiently written memory cell is found, supplying said program execution number to said write-verify means, and for forcing said write-verify means to perform the rewrite operation for the insufficiently written memory cell.

12. A device according to claim 11, wherein said write-verify means performs the rewrite operation by applying the write voltage to the insufficient cell for a predetermined period of time.

13. A device according to claim 11, wherein said write-verify means repeats a combination of a rewrite operation and a verify operation in the range of a predetermined number of times until said insufficient cell reaches the reference state.

14. A device according to claim 11, wherein said write-verify means and said write adjuster means are mounted on a separate semiconductor integrated circuit chip substrate.

15. A device according to claim 14, wherein said chip substrate is built in a card-shaped solid-state portable structure.

16. A device according to claim 15, wherein said insulated-gate transistor includes a floating-gate tunneling metal oxide semiconductor field effect transistor.

17. A non-volatile semiconductor memory system comprising:

a memory cell array including rows and columns of electrically erasable and programmable memory cell transistors;

write means for selecting from said memory cell transistors a first sub-array of memory cell transistors corresponding to one page, and for programming the first subarray;

write-verify means for verifying the electrical written state of the selected memory cell transistors by checking their threshold values for variations, and for, when any insufficiently written cell transistor remains among them, repeating a rewrite operation using a predetermined voltage for a predetermined period of time so that the written state comes closer to a satisfiable state; and said write-verify means comprising means for counting repetitions of the rewrite operation performed on said first sub-array of memory cell transistors until said written state is sufficiently close to said satisfiable state, producing a count value corresponding to the number of times said rewrite operation is repeated until said satisfiable state is attained, and employing said count value in executing the write operation for a second sub-array of memory cell transistors corresponding to a second page such that the write operation executed for said second sub-array is automatically repeated a fixed number of times corresponding to said count value, the verify operations associated with said write-verify means being omitted during performing of said rewrite operations on said second sub-array of memory cell transistors.

18. A device according to claim 17, wherein said write-verify means is mounted on a separate semiconductor integrated circuit chip substrate.

19. A device according to claim 18, wherein said chip substrate is built in a card-shaped-solid-state portable structure.

20. A device according to claim 19, wherein said electrically erasable and programmable memory cell transistor includes a floating-gate tunneling metal oxide semiconductor field effect transistor.

* * * * *